United States Patent
Gill et al.

(10) Patent No.: US 10,483,257 B2
(45) Date of Patent: Nov. 19, 2019

(54) LOW VOLTAGE NPN WITH LOW TRIGGER VOLTAGE AND HIGH SNAP BACK VOLTAGE FOR ESD PROTECTION

(71) Applicant: Freescale Semiconductor, Inc., Austin, TX (US)

(72) Inventors: Chai Ean Gill, Chandler, AZ (US); Changsoo Hong, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 501 days.

(21) Appl. No.: 14/182,937

(22) Filed: Feb. 18, 2014

(65) Prior Publication Data
US 2015/0236009 A1    Aug. 20, 2015

(51) Int. Cl.
| | |
|---|---|
| H01L 27/02 | (2006.01) |
| H01L 29/66 | (2006.01) |
| H01L 29/735 | (2006.01) |
| H01L 29/06 | (2006.01) |
| H01L 29/08 | (2006.01) |
| H01L 29/10 | (2006.01) |
| H01L 21/762 | (2006.01) |

(52) U.S. Cl.
CPC .... *H01L 27/0259* (2013.01); *H01L 21/76283* (2013.01); *H01L 29/0649* (2013.01); *H01L 29/0808* (2013.01); *H01L 29/0821* (2013.01); *H01L 29/1008* (2013.01); *H01L 29/6625* (2013.01); *H01L 29/735* (2013.01)

(58) Field of Classification Search
CPC ............... H01L 27/0259; H01L 29/735; H01L 29/0821; H01L 29/66234; H01L 29/6625
USPC ......................................................... 257/355
See application file for complete search history.

(56) References Cited

U.S. PATENT DOCUMENTS

| | | | | |
|---|---|---|---|---|
| 5,850,095 A | * | 12/1998 | Chen ................... | H01L 27/0248 257/175 |
| 5,994,202 A | * | 11/1999 | Gambino .......... | H01L 21/76229 257/354 |
| 6,853,053 B1 | | 2/2005 | Vaschenko et al. | |
| 7,723,823 B2 | | 5/2010 | Gill et al. | |
| 8,648,419 B2 | | 2/2014 | Gendron et al. | |
| 2009/0032814 A1 | * | 2/2009 | Vashchenko ........ | H01L 27/0259 257/51 |
| 2009/0231766 A1 | * | 9/2009 | Chang ................. | H01L 27/0277 361/56 |
| 2010/0230719 A1 | * | 9/2010 | Sawahata ............ | H01L 27/0259 257/173 |

(Continued)

OTHER PUBLICATIONS

W.Y. Chen et al., U.S. Appl. No. 13/946,613, filed Jul. 31, 2013, entitled Protection Device and Related Fabrication Methods.

(Continued)

*Primary Examiner* — Fazli Erdem

(57) ABSTRACT

An area-efficient, low voltage ESD protection device (200) is provided for protecting low voltage pins (229, 230) against ESD events by using one or more stacked low voltage NPN bipolar junction transistors, each formed in a p-type material with an N+ collector region (216) and P+ base region (218) formed on opposite sides of an N+ emitter region (217) with separate halo extension regions (220-222) formed around at least the collector and emitter regions to improve the second trigger or breakdown current (It2) and set the snapback voltage (Vsb) and triggering voltage (Vt1) at the desired level.

11 Claims, 7 Drawing Sheets

(56) References Cited

U.S. PATENT DOCUMENTS

| | | | |
|---|---|---|---|
| 2011/0006341 A1* | 1/2011 | Sawahata | H01L 27/0259 |
| | | | 257/143 |
| 2011/0176244 A1 | 7/2011 | Gendron et al. | |
| 2012/0119330 A1* | 5/2012 | Hwang | H01L 29/735 |
| | | | 257/566 |

OTHER PUBLICATIONS

J. Z. Chen et al., Design and Layout of a High ESD Performance NPN Structure for Submicron BiCMOS/Bipolar Circuits, 34th Annual Proceedings, IEEE International Reliability Physics Symposium, Apr. 30-May 2, 1996.

* cited by examiner

LOW VOLTAGE NPN WITH LOW TRIGGER VOLTAGE AND HIGH SNAP BACK VOLTAGE FOR ESD PROTECTION

BACKGROUND OF THE INVENTION

1. Field of the Invention

The present invention is directed in general to integrated circuit devices and methods for manufacturing same. In one aspect, the present invention relates to the manufacture and use of semiconductor devices used for electrostatic discharge (ESD) protection in integrated and other circuits.

2. Description of the Related Art

To protect against electrostatic discharge (ESD) events in integrated circuit devices, ESD protection or clamp devices are typically provided as voltage limiting devices across the inputs and/or other terminals of such integrated circuit devices. ESD protection devices are intended to remain quiescent during normal operation of the associated integrated circuit devices when used with normal operating voltage $V_O$, but turn on when excessive voltage arises, thereby preventing damage to any protected elements in the integrated circuit devices.

Some ESD clamp circuits use bipolar transistors and/or silicon controlled rectifier circuits (a.k.a., thyristor circuits) between the protected terminals which turn "on" at an initial triggering threshold voltage Vt1, and conduct current when voltage across the protected terminals rises beyond a predetermined triggering threshold voltage or limit. The initial trigger voltage Vt1 is usually closely correlated to DC BV for breakdown-triggered devices. In operation, as the voltage applied to the terminals is increased, very little current flows through the ESD clamp circuit until the triggering threshold voltage Vt1 is reached, at which point the ESD clamp circuit begins conducting current up to a snapback point (defined by a higher holding current Isb and lower holding voltage Vsb) after which, depending upon the internal on-state resistance $R_{ON}$ of ESD claim circuit, the current and voltage may further increase to second trigger or breakdown point (Vt2, It2) beyond which destructive failure may occur leading to further current increase accompanied by voltage decrease. In certain applications for protecting low voltage pins (e.g., 5V-5.5V) against transient current and voltage changes, the existing solutions for providing a discharge protection circuit which is capable of low triggering voltage (Vt1) and high snapback voltage (Vsb) with minimal circuit footprint is extremely difficult at a practical level. For example, gate-coupled-NMOS-based ESD clamps show an undesirable transient voltage (dv/dt).

BRIEF DESCRIPTION OF THE DRAWINGS

The present invention may be understood, and its numerous objects, features and advantages obtained, when the following detailed description is considered in conjunction with the following drawings.

Figure 1:
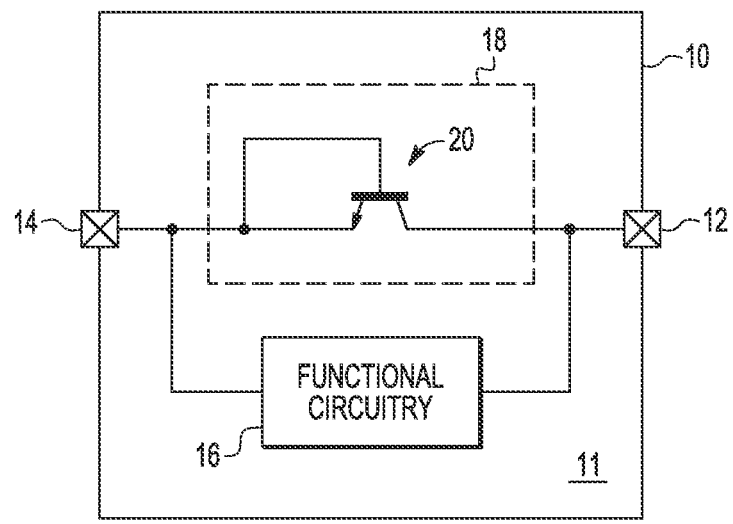
FIG. 1 shows a simplified circuit schematic diagram of an exemplary electronic device in accordance with selected embodiments of the present disclosure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

An NPN-based ESD protection circuit and associated fabrication process are provided for protecting low voltage pins against voltage or current fluctuations. The NPN-based ESD protection circuit uses one or more stacked low voltage NPN bipolar junction transistors, each formed in a p-type material with an N+ collector region and P+ base region formed on opposite sides of an N+ emitter region, and with separate halo extension regions formed around at least the collector and emitter regions to improve the second trigger or breakdown current (It2). This reduced the footprint of the low voltage ESD protection circuits and lowers the susceptibility to rectification without reducing robustness and functionality.

In selected embodiments, halo extension regions are formed around only the collector and emitter regions with a combination of a shallow n-type LDD extension implant and a heavier and deeper p-type halo implant to surround and enclose the collector and emitter regions, while in other embodiments, halo extension regions are formed to surround and enclose the collector, emitter, and base regions. By grading the junctions of the N+ emitter and collector regions with the halo extension regions, the resulting low voltage NPN-based semiconductor structure supports higher junction temperatures to provide the larger transient current conduction.

In addition, the collector-emitter spacing dimension ($W_B$) may be controlled to be predetermined length (e.g., 0.5 um) to set the triggering voltage (Vt1) at the desired level. As disclosed, the low voltage NPN-based semiconductor structure is very compact without the additional implant enhancement on the collector, and can achieve a low initial triggering threshold voltage Vt1 (e.g., approximately 8.5V) with sufficiently high snapback voltage Vsb (e.g., approximately 6V) to be suitable for providing ESD protection to low voltage pins (e.g., 5V-5.5V pins). In addition, the disclosed low voltage NPN-based semiconductor structure provides a high failure current (e.g., 5 A or approximately 660 uA/um$^2$) that is substantially higher than conventional ESD clamps. In addition, the formation of isolation structures around each NPN-based ESD protection circuit allows multiple low voltage NPN bipolar junction transistors to be stacked to increase the initial triggering threshold voltage Vt1 and snapback voltage Vsb.

Turning now to FIG. 1, there is shown a simplified circuit schematic diagram of an exemplary electronic device package 10 which includes one or more package interfaces 12, 14, functional circuitry 16 coupled to the package interfaces 12, 14, and protection circuitry 18 coupled to the interfaces 12, 14. In selected embodiments, the functional circuitry 16 and the protection circuitry 18 are formed, fabricated, mounted, or otherwise provided on a substrate (or die) 11 and/or encapsulated in a common device package to achieve the packaged electronic device 10. In this regard, in some embodiments, the substrate 11 may be realized as a semiconductor substrate having both the functional circuitry 16 and the protection circuitry 18 fabricated thereon, while in other embodiments, the substrate 11 may be realized as a package substrate (e.g., a lead frame, circuit board, or the like) that the functional circuitry 16 and the protection circuitry 18 are soldered, affixed, or otherwise mounted to. As will be appreciated, the simplified representation of the electronic device 10 is provided for purposes of explanation and ease of description, and is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 12, 14 generally represent the physical input/output interfaces to/from the functional circuitry 16 encapsulated in the electronic device 10. Depending on the embodiment, each of the package interfaces 12, 14 may be realized as an individual pin, pad, lead, terminal, solder ball, or another suitable physical interface to the electronic device 10. In accordance with one or more embodiments, the design (or intended) voltage for the first package interface 12 is greater than the design voltage for the second package interface 14. For example, the first package interface 12 may be realized as a positive reference (or supply) voltage input to the electronic device 10 and the second package interface 14 is realized as a negative reference (or ground) voltage input to the electronic device 10. Accordingly, for purposes of explanation, but without limitation, the first package interface 12 may alternatively be referred to herein as the higher voltage terminal, the positive reference voltage terminal, the supply voltage terminal, or the like, while the second package interface 14 may alternatively be referred to herein as the lower voltage terminal, the negative reference voltage terminal, the ground voltage terminal, or the like.

The functional circuitry 16 generally represents the components of the electronic device 10 configured to provide the desired functionality for the electronic device 10. Thus, the functional circuitry 16 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 10. In selected embodiments, the functional circuitry 16 is coupled to the package interfaces 12, 14 to receive a supply voltage, design voltage, or another operating voltage that facilitates the desired operation of the functional circuitry 16.

Still referring to FIG. 1, the protection circuitry 18 is connected electrically between the higher voltage terminal 12 and the lower voltage terminal 14 and configured electrically parallel to the functional circuitry 16 to protect the functional circuitry 16 from a transient voltage difference between the device terminals 12, 14 that exceeds a breakdown voltage ($V_B$) of the functional circuitry 16. In the illustrated embodiment, the protection circuitry 18 functions as an ESD voltage clamp that begins conducting current when the transient voltage at the higher voltage terminal 12 relative to the voltage at the lower voltage terminal 14 exceeds a transient triggering voltage ($V_{T1}$) of the protection circuitry 18. In this regard, both the steady state (or DC) breakdown voltage ($V_{TDC}$) and transient triggering voltage ($V_{T1}$) of the protection circuitry 18 are chosen to be greater than the supply (or operating) voltage ($V_O$) of the functional circuitry 16 but less than the breakdown voltage ($V_B$) of the functional circuitry 16. In this manner, the protection circuitry 18 conducts current when the voltage difference between the terminals 12, 14 exceeds a ESD triggering voltage (i.e., the DC breakdown voltage ($V_{TDC}$) or the transient triggering voltage ($V_{T1}$)) and thereby clamps the voltage difference that the functional circuitry 16 is exposed to. Thus, the likelihood of the functional circuitry 16 being exposed to a voltage difference that exceeds the breakdown voltage ($V_B$) of the functional circuitry 16 during an ESD event is reduced.

Figure 2:
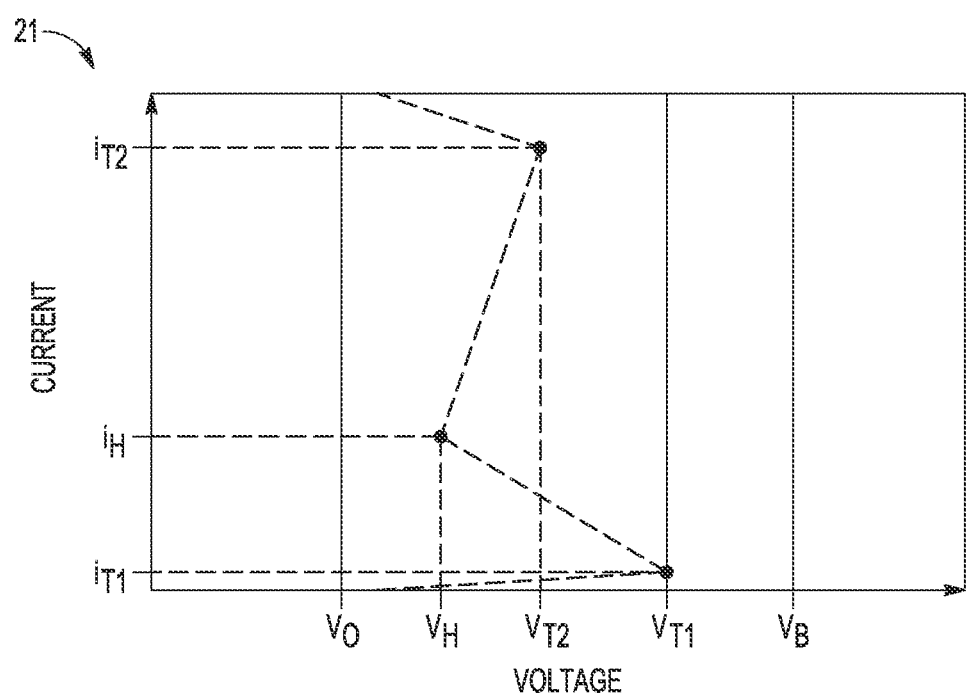
FIG. 2 shows a simplified plot of current versus voltage function of the ESD protection device shown in FIG. 1.

FIG. 2 shows a simplified plot 21 of current versus voltage function of the ESD protection device shown in FIG. 1. As shown in FIG. 2, as voltage applied to the higher voltage terminal 12 is increased relative to the voltage at the lower voltage terminal 14, very little current flows through the protection circuitry 18 until the transient triggering voltage ($V_{T1}$) of the protection circuitry 18 is reached, at which point avalanche breakdown in the bipolar junction device (BJT) 20 occurs and the protection circuitry 18 begins conducting an ESD discharge current. The current through the protection circuitry 18 increases from a triggering current ($I_{T1}$) at the transient triggering point to a holding current ($I_H$) at a holding (or snapback) voltage ($V_H$), at which point the protection circuitry 18 will stop conducting current if the applied at the higher voltage terminal 12 relative to the voltage at the lower voltage terminal 104 falls below the holding voltage. Alternatively, if the applied ESD voltage (or current) increases, the discharge current through the protection circuitry 18 increases until reaching a thermal breakdown current ($I_{T2}$) at voltage ($V_{T2}$), at which point functionality of the protection circuitry 18 may be irreversibly impaired. This current ($I_{T2}$) may alternatively be referred to as the damage onset threshold current or secondary breakdown current.

Referring back to FIG. 1, selected embodiments of the protection circuitry 18 include a bipolar junction transistor (BJT) element 20 configured to provide an ESD voltage clamp. The illustrated BJT element 20 may be realized as an NPN bipolar transistor element having a collector electrode coupled to the higher voltage terminal 12, an emitter electrode coupled to the lower voltage terminal 14, and a base electrode electrically connected directly to the emitter electrode (e.g., short-circuited or via a negligible series impedance) and coupled to the lower voltage terminal 14. In this configuration, the BJT element 20 functions as silicon-controlled rectifier (SCR), with the collector electrode functioning as an anode of the SCR, the emitter electrode functioning as a cathode of the SCR, and the base electrode functioning as a gate of the SCR. It should be noted that while selected embodiments may be described herein in the context of NPN bipolar junction transistor elements, the subject matter is not intended to be limited to NPN bipolar junction transistor elements and may be implemented in an equivalent manner for PNP bipolar junction transistor elements. That said, the benefits of NPN bipolar junction transistor elements often make NPN bipolar junction transistor elements preferable for many applications. Accordingly, for purposes of explanation but without limitation, the subject matter is described herein in the context of NPN devices. As described above, protection circuitry 18 is unidirectional and capable of conducting current from the higher voltage terminal 12 to the lower voltage terminal 14 to clamp voltages between terminals 12, 14 from ESD events when the voltage at the higher voltage terminal 12 exceeds the voltage at the lower voltage terminal 14 by more than a transient triggering voltage and/or a DC breakdown voltage for the protection circuitry 18.

Figure 3:
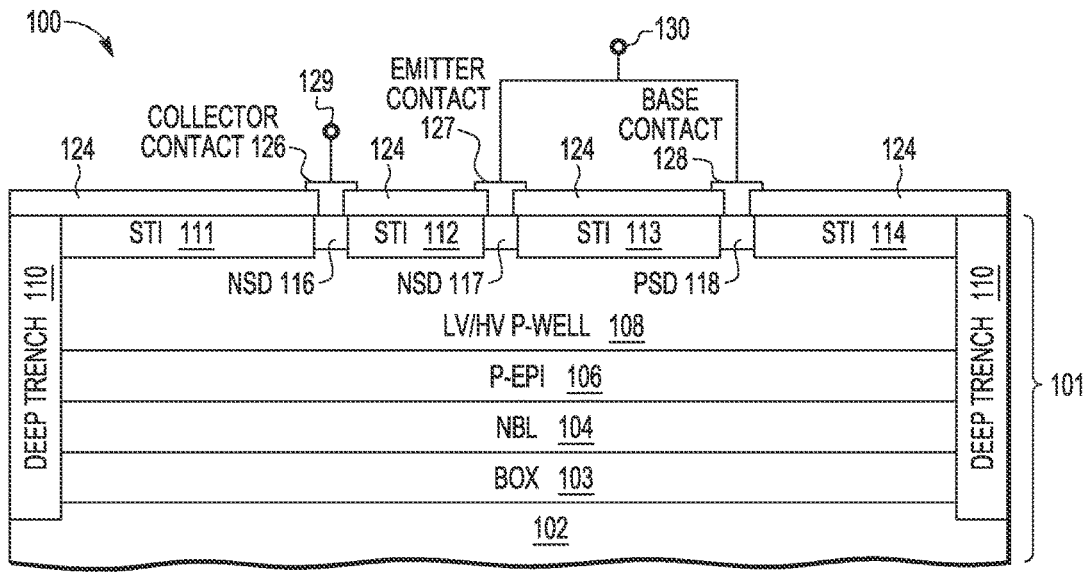
FIG. 3 shows a partial cross-sectional view of an exemplary NPN-based semiconductor structure that is suitable for use as an ESD protection device in accordance with selected embodiments of the present disclosure.

FIG. 3 shows a partial cross-sectional view of an exemplary NPN-based semiconductor structure 100 that is suitable for use as an ESD protection device in accordance with selected embodiments of the present disclosure. The protection device structure 100 includes a bipolar junction transistor (BJT) device formed in a substrate 101 with an N+ collector region 116 (e.g., N+ source/drain implant) and P+ base region 118 (e.g., P+ source/drain implant) formed on opposite sides of an N+ emitter region 117 (e.g., N+ source/drain implant). As described herein, the collector region 116 is coupled through a collector contact terminal 126 to a first package interface 129 corresponding to a higher voltage terminal of the electronic device 100, while the emitter region 117 and the base region 118 are electrically connected to one another through emitter and base contact terminals 127, 128 which are coupled to a second package interface 130 corresponding to a lower voltage terminal of the electronic device. Though the various structures, well, and layer regions are illustrated in simplified form with straight lines and corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. The depicted NPN-based semiconductor structure 100 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

As depicted, the NPN semiconductor structure 100 may be formed on or as part of a substrate 101 formed with one or more insulator layers and semiconductor layers doped with different conductivity type impurities. As will be appreciated, the substrate 101 may be formed as a bulk semiconductor substrate or a semiconductor-on-insulator (SOI) type substrate in which one or more additional semiconductor layers and/or well regions are formed using epitaxial semiconductor growth and/or selective doping techniques as described more fully hereinbelow. Thus, there is no specific substrate type required. And depending on the type of device being fabricated, the substrate 101 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof, alone or in combination with an epitaxial layer (e.g., p-type epi layer). However formed, the substrate 101, alone or in combination with any additional layers or regions formed therein, has an upper surface defining the uppermost extent of the substrate.

In selected embodiments, the substrate 101 may include a first semiconductor substrate layer 102, such as a n-type substrate layer 102 having a predetermined P doping level (e.g., approximately 1E18 to 5E18 cm$^{-3}$), though any desired dopant type and/or concentration may be used. As illustrated, the substrate 101 may be embodied as a semiconductor-on-insulator (SOI) substrate that includes a buried layer of oxide or dielectric material 103 formed over the substrate layer 102, and an epitaxial semiconductor layer 106 (e.g., p-type epi layer) formed over the buried oxide layer 103. However, it should be noted that the subject matter described herein is not limited to SOI substrates, and the protection device structure 100 may also be fabricated on a bulk semiconductor substrate.

In the substrate 101, an isolation structure may be formed to include an N+ buried layer 104, alone or in combination with one or more deep n-type sinker wells (not shown). In addition, a deep trench structure 110 may be formed to contact the substrate layer 102 and to provide lateral isolation for the subsequently formed NPN device. Though not illustrated in detail, the deep trench structures 110 may be formed by etching deep trench openings down to the substrate layer 102, forming one or more dielectric layers (e.g., a liner oxide and one or more TEOS trench fill layers) in the deep trench openings, cleaning or removing the dielectric layer(s) from the bottom of the deep trench openings, and then filling the trench openings with a conductive or doped deep trench poly layer to establish an electrical connection to the substrate layer 102. As for the N+ buried layer 104, a mask may be used to selectively implant n-type impurities (e.g., Antimony) into the substrate 101 with a predetermined implant energy and dopant concentration (e.g., 1E18 to 1E20 cm$^{-3}$) so as form the n-type buried layer 103 below the subsequently-formed p-well regions 108. As will be appreciated, the N+ buried layer 104 may be a buried layer, epitaxial layer or any N-type layer formed in any manner. The deep trench structures 110, in combination with N+ buried layer 104, form an isolation tub or feature which may be used to conductively isolate the NPN semiconductor structure 100 from the rest of the integrated circuit.

Above the buried layer 104, one or more semiconductor layers 106, 108 are formed to a predetermined thickness of a material having the first conductivity type (e.g., p-type) impurities. For example, a first epitaxial layer 106 (e.g., p-type epi layer) may be formed by growing a p-type semiconductor layer from the N+ buried layer 104 by implanting p-type impurities into an existing semiconductor or by growing an epitaxial p-type layer having a thickness in the range of approximately 1.5-5 um with a p-type doping concentration (e.g., approximately 1E14 to 1E16 cm$^{-3}$, and more preferably 1E15 cm$^{-3}$), though other dopant types, thicknesses, and/or concentrations may be used. However formed, the doping concentration and/or epitaxial growth conditions are selected and controlled to form the p-type semiconductor layer 106 as a lightly doped p-type layer for the subsequently-formed well regions. At this stage of the process, the epitaxial p-type layer 106 may be formed over the entirety of the N+ buried layer 104 using any desired epitaxial process for growing or depositing a p-type semiconductor layer to the desired thickness and doping concentration.

In the p-type epi layer 106, the p-type well region or layer(s) 108 may be formed with one or more implantation steps. For example, by using an implant mask (not shown) to selectively implant p-type impurities into the p-type semiconductor layer 106, the p-type well region or layer(s) 108 may be formed to a predetermined depth of a material having the first conductivity type (e.g., p-type) impurities so as to be located to surround and contain each subsequently-formed terminal contact regions 116-118. For example, the p-type well region or layer(s) 108 may be formed with a low voltage p-type diffusion by using a mask or other technique to selectively diffuse or implant p-type impurities using a predetermined implant energy and dopant concentration (e.g., 1E16 to 1E19 $cm^{-3}$, and more preferably 5E16 to 5E18 $cm^{-3}$, and more preferably 1E17 $cm^{-3}$) to a predetermined depth (e.g., 1-1.5 um), though other dopant types, depths, and/or concentrations may be used. In addition, the p-type well region or layer(s) 108 may be formed with a high voltage p-type diffusion by selectively diffusing or implanting p-type impurities using a predetermined implant energy and dopant concentration (e.g., 1E15 to 1E18 $cm^{-3}$, and more preferably 5E15 to 5E17 $cm^{-3}$, and more preferably 1E16 $cm^{-3}$) to a predetermined depth (e.g., 1-1.5 um), though other dopant types, depths, and/or concentrations may be used. As formed, the resulting low voltage/high voltage p-well regions 108 is generally somewhat more heavily doped than p-type semiconductor layer 106. However formed, the doping concentration, implant energy, and junction depth are selected and controlled to form the low voltage/high voltage p-well region 108 so that it is completely contained within the p-type semiconductor layer 106.

After forming the low voltage/high voltage p-well region 108, shallow trench isolation (STI) regions 111-114 may be formed in an upper portion of the substrate 101 to define and delineate the emitter region 116, collector region 117, and the base region 118. The STI regions 111-114 may be formed by selectively etching trench openings in the substrate 101 using an etch mask, filling the openings with appropriate isolation material(s), and then polishing or planarizing the isolation material(s) isolation down to the surface of the substrate 101. Though illustrated as STI regions, it will be appreciated that field oxide regions may also be used, or any other desired dielectric material which forms an electrical isolation barrier between the emitter, collector, and base regions.

After forming the STI regions 111-114, a plurality of separate implant mask and implantation processes are used to form the contact region(s) 116-118, including collector N+ region 116, emitter N+ region 117, and base P+ region 118. For example, the n+ contact regions 116, 117 may be formed by using an implant mask (not shown) to selectively implant n-type impurities between exposed openings in the STI regions 111-114 and into the p-well region 108 to a predetermined depth (e.g., about 0.1-0.3 microns) using a predetermined implant energy and dopant concentration (e.g., 1E19-1E21 $cm^{-3}$), though other dopant types, thicknesses, and/or concentrations may be used. In similar fashion, the p+ contact regions 118 may be formed by using an implant mask (not shown) to selectively implant p-type impurities between exposed openings in the STI regions 111-114 and into the p-well region 108 to a predetermined depth (e.g., about 0.1-0.3 microns) using a predetermined implant energy and dopant concentration (e.g., 1E19-1E21 $cm^{-3}$), though other dopant types, thicknesses, and/or concentrations may be used. In this way, each of the emitter and collector regions 116, 117 are relatively shallow regions that do not extend below the adjacent STI regions 111-114, and are formed in or otherwise reside within the p-well region 108 having an opposite conductivity type as the emitter and collector regions 116, 117. Similarly, the base region 108 is also relatively shallow, and is formed in or otherwise resides within the p-well region 108 as a heavily doped region having the same conductivity type as the p-well region 108.

During back-end processing, one or more metallization layer(s) 126, 128 are formed to connect the NPN protection device structure 100 to external circuitry with the collector N+ region 116 connected to a first node 129, and the emitter N+ region 117 and base P+ region 118 connected together to a second node 130. For example, after forming the contact region(s) 116-118, a dielectric or masking layer 124 is deposited, patterned and selectively etched to define openings over the contact regions 116-118. With the contact regions 116-118 exposed, a conductive layer is deposited, masked and selectively etched to form first and second conductors 126, 128. The first conductor 126 is formed to make ohmic contact to the collector n+ contact regions 116 for connection to a first connection terminal 129. The same processing steps may be used to form the second conductor 128 in ohmic contact to the emitter n+ contact region 117 and base p+ contact region 118 for connection to a second connection terminal 130.

By forming the collector n+ contact region 116 and emitter n+ contact region 117 in direct contact with the low voltage/high voltage p-well regions 108 without any halo extension regions (described below), the resulting low voltage NPN-based semiconductor structure 100 provides a smaller footprint circuit than conventional gate coupled NMOS clamps (e.g., 60% smaller). In addition, the low voltage NPN-based semiconductor structure 100 can achieve a low initial triggering threshold voltage Vt1 (e.g., approximately 9V) and good snapback voltage Vsb (e.g., approximately 6.8V) to be suitable for providing ESD protection to low voltage pins (e.g., 5V-5.5V pins). However, the low voltage NPN-based semiconductor structure 100 provides a relatively low failure current (e.g., It2=1.5 Å) that is smaller than conventional gate coupled NMOS clamps.

Figure 4:
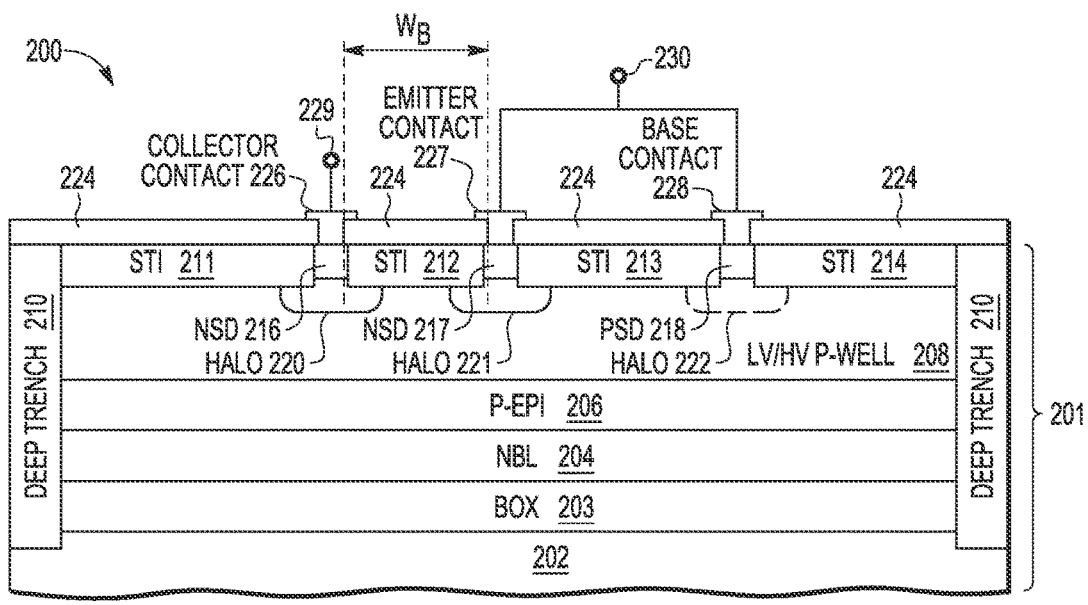
FIG. 4 shows a partial cross-sectional view of another exemplary NPN-based semiconductor structure with one or more halo regions formed around the terminal contact regions that is suitable for use as an ESD protection device in accordance with selected embodiments of the present disclosure.

To provide a non-dv/dt triggered clamp for low voltage pins with a low triggering voltage (Vt1), high snapback voltage (Vsb), and a larger trigger current (It2), reference is now made to FIG. 4 which shows a partial cross-sectional view of an exemplary NPN-based semiconductor structure 200 with one or more halo regions 220, 221, 222 formed around selected terminal contact regions that is suitable for use as an ESD protection device. Similar to the NPN-based semiconductor structure 100 shown in FIG. 1, the structural details will not be discussed at length, other than to note that the NPN-based semiconductor structure 200 includes a BJT device formed in a multi-layered substrate 201 which includes a substrate layer 202 (e.g., n-type substrate), a buried oxide layer 203, epitaxial semiconductor layer 206 (e.g., p-type epi layer), and one or more well regions 208 (e.g., low voltage p-well and high voltage p-well). In the substrate 201, an isolation structure is formed with a buried isolation layer 204 (e.g., n-type buried layer) and surrounding deep trench structures 210 (e.g., deep trench openings having isolation layers formed on the trench sidewalls and a doped poly layer extending down to the substrate layer 202) which surround, encircle and isolate the NPN-based semiconductor structure 200 in the substrate 201. In the substrate 201 between defined openings in the STI regions 211-214, an N+ collector region 216 (e.g., N+ source/drain implant) and P+ base region 218 (e.g., P+ source/drain implant) are formed on opposite sides of an N+ emitter region 217 (e.g., N+ source/drain implant). In addition, the collector region 216 is coupled through a collector contact terminal 226 to a first package interface 229, while the emitter region 217 and the base region 218 are electrically connected to one another through emitter and base contact terminals 227, 228 which are coupled to a second package interface 230.

In contrast to the NPN-based semiconductor structure 100, the NPN-based semiconductor structure 200 includes halo regions 220-222 formed around at least the collector and emitter terminal contact regions 216, 217, if not also the base terminal contact region 218. In the semiconductor industry, a halo region refers to a substrate surface region having increased doping to alter or adjust the location of a boundary region and the associated electrical performance thereof. For example, relatively shallow halo regions are formed at the drain region of a transistor to reduce the lateral extent of the depletion region in the body at the drain junction. As disclosed herein, separate halo extension regions 220, 221 are formed around only the collector and emitter regions 216, 217, thereby surrounding and enclosing the collector and emitter regions 216, 217. By adding the halo extension regions, the junctions of at least the N+ emitter and collector regions 216, 217 are graded to improve with the trigger or breakdown current (It2) performance. In other embodiments, separate halo extension regions 220-222 are formed to surround and enclose the collector, emitter, and base regions 216-218. To form the halo extension regions 220-222, a combination of a shallow n-type LDD extension implantation and a heavier and deeper p-type halo implantation may be performed between defined openings in the STI regions 211-214. In other embodiments, the halo extension regions 220-222 may be formed with only a p-type implantation. In embodiments where there is no halo extension region 222 formed around the base terminal contact region 218, an implant mask (not shown) may be formed to cover the base terminal contact region 218, thereby preventing implantation. By grading the junctions of at least the N+ emitter and collector regions 216, 217 with the halo extension regions 220, 221, the resulting low voltage NPN-based semiconductor structure 200 supports higher junction temperatures to provide the larger transient current conduction. In addition, the collector-emitter spacing dimension ($W_B$) may be controlled to be predetermined length (e.g., 0.5 um) to set the triggering voltage (Vt1) at the desired level. As disclosed, the low voltage NPN-based semiconductor structure 200 is a compact protection device having a low initial triggering threshold voltage Vt1 (e.g., approximately 8.5V), high snapback voltage Vsb (e.g., approximately 6V), and high trigger or breakdown current It2 (e.g., 5 Å or approximately 660 uA/um$^2$) for providing ESD protection to low voltage pins (e.g., 5V-5.5V pins). In addition, the disclosed low voltage NPN-based semiconductor structure 200 may be stacked with other multiple low voltage NPN bipolar junction transistors to increase the initial triggering threshold voltage Vt1 and snapback voltage Vsb.

Figure 5:
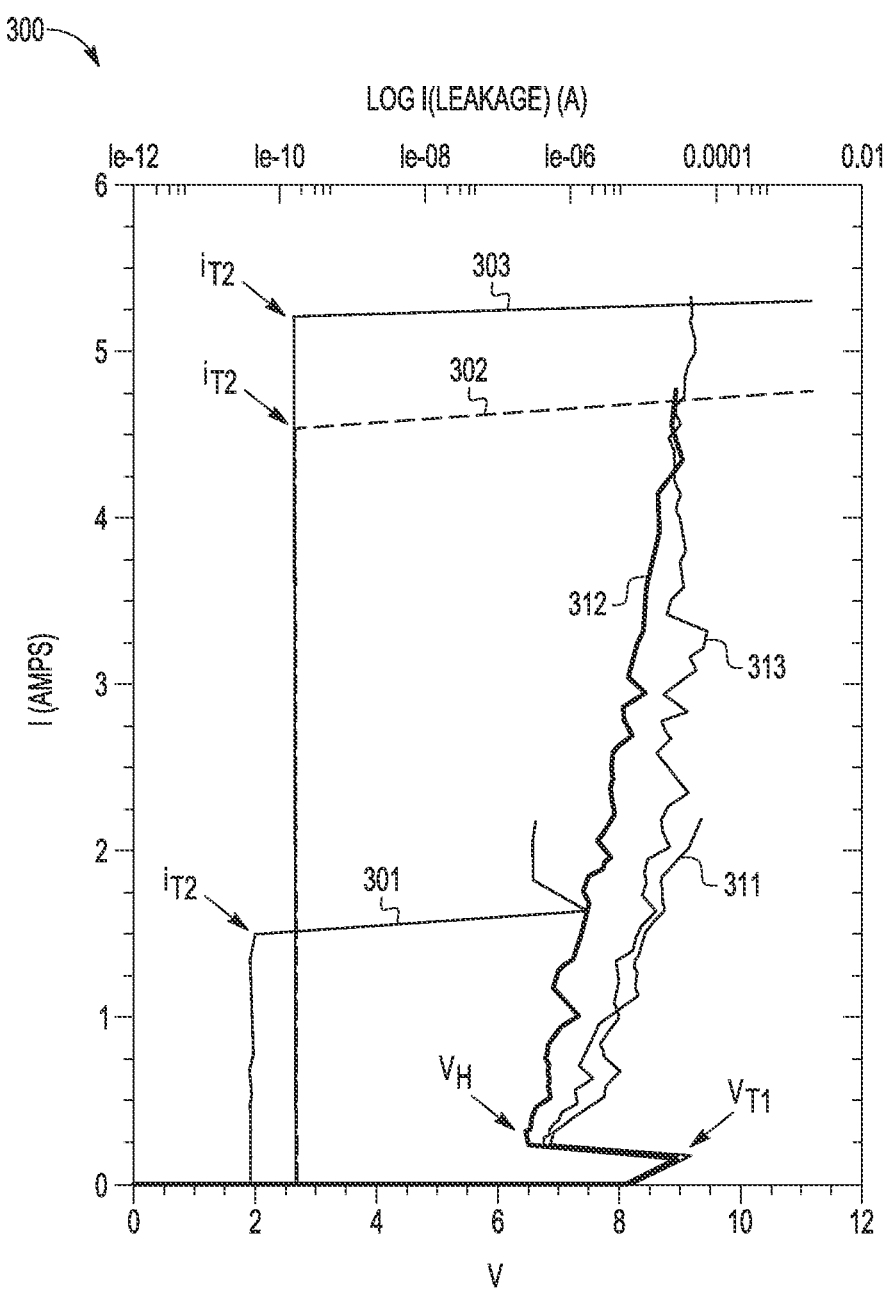
FIG. 5 is a comparative plot of the current versus voltage functions for different embodiments of the low voltage NPN-based semiconductor structures disclosed herein.

To illustrate the performance of NPN-based semiconductor structures disclosed herein, reference is now made to FIG. 5 which shows a comparative plot 300 of the transmission line pulse (TLP) current versus voltage functions for different embodiments of the low voltage NPN-based semiconductor structures disclosed herein under a forward ESD transient event. For example, plot line 301 shows the leakage current of NPN-based semiconductor structure without any halo extension regions (e.g., NPN structure 100), while corresponding plot line 311 shows the corresponding transmission line pulse current versus voltage for the NPN-based semiconductor structure without any halo extension regions, indicating a transient triggering voltage ($V_{T1}$) of 9V, a holding (or snapback) voltage ($V_H$) of 6.8V, and a trigger or breakdown current (It2) of 1.5 Å. In similar fashion, plot line 302 shows the leakage current of NPN-based semiconductor structure with halo extension regions formed around the collector, emitter, and base regions (e.g., NPN structure 200), while corresponding plot line 312 shows the corresponding transmission line pulse current versus voltage for the NPN-based semiconductor structure 200 with emitter, collector, and base halos, indicating a transient triggering voltage ($V_{T1}$) of 9V, a holding (or snapback) voltage ($V_H$) of 6.5V, and a trigger or breakdown current (It2) of 4.5 Å. Finally, plot line 303 shows the leakage current of NPN-based semiconductor structure with halo extension regions formed around only the collector and emitter regions (e.g., NPN structure 200), while corresponding plot line 313 shows the corresponding transmission line pulse current versus voltage for the NPN-based semiconductor structure 200 with emitter and collector halos, indicating a transient triggering voltage ($V_{T1}$) of 8.5V, a holding (or snapback) voltage ($V_H$) of 6.8V, and a trigger or breakdown current (It2) of 5.2 Å. From the comparative plot 500, it can be seen that an NPN-based semiconductor structure with graded halo junctions around the collector, emitter, and base regions improves the trigger or breakdown current (It2) by a factor of 3× compared to an NPN-based semiconductor structure without graded halo junctions. In addition, an NPN-based semiconductor structure with graded halo junctions around the only the collector and emitter regions improves the trigger or breakdown current by even more.

To illustrate an example fabrication sequence for forming low voltage NPN-based semiconductor structures in accordance with selected embodiments of the present disclosure, reference is now made to FIGS. 6-10 which illustrate partial cross-sectional side views of various stages in the production. Though the illustrated NPN structures are illustrated in simplified form, it will be appreciated that the actual NPN structures will not necessarily conform to simplified depictions, but will instead depend on the specific fabrication process(es) and/or structures used.

Figure 6:
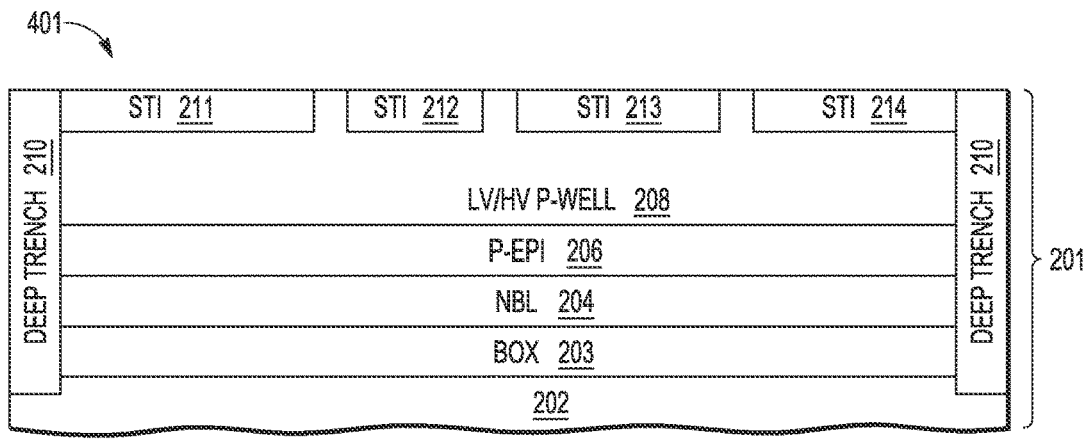
FIGS. 6-10 show cross-sectional views at different stages of fabricating a low voltage NPN-based semiconductor structure in accordance with selected embodiments of the present disclosure.

Referring first to FIG. 6, there is shown a partial cutaway side view 401 of a semiconductor substrate 201 in which a low voltage NPN protection device structure is fabricated, such as a SOI substrate having a support (or handle) layer 202 of semiconductor material, an insulating layer 203 of dielectric material on or otherwise overlying the support layer 202, an buried isolation layer 204 of a first conductivity type (e.g., n-type), a semiconductor layer 206 of a second conductivity type (e.g., epitaxial p-type silicon), and heavily doped semiconductor region or well 208 of the second conductivity type. In selected embodiments, the semiconductor material of each of the layers 202, 204, 206, 208 is formed with any desired semiconductor material (e.g., silicon, germanium, carbon, and the like) that is undoped or doped with other p-type and/or n-type dopants at whatever concentration and depth is required to provide the specified functionality. In addition, the insulating layer 203 may be formed with an oxide layer formed in a subsurface region of the semiconductor substrate 201, also known as a buried oxide (BOX) layer. For example, the buried oxide layer 203 may be formed by oxidizing a wafer of semiconductor material (e.g., layer 204) which is then bonded to the support layer 202 to provide a buried layer 203 of oxide material between the support layer 202 and the buried layer 204.

In the substrate 201, isolation structures may be formed to isolate the protection circuitry from adjacent semiconductor devices. For example, deep trench structures 210 may be formed with a sidewall insulator and central doped poly layer extending down to the substrate layer 202 to surround the region in the semiconductor substrate 201 where the low voltage NPN protection device structure will be fabricated. Additionally, shallow isolation regions 211-214 may be formed with one or more dielectric layers formed in the upper portions of substrate 201. To form the shallow isolation regions 211-214, portions of the heavily doped semiconductor region or well 208 are masked with a masking material that is patterned to expose portions of the substrate 201 adjacent to the intended collector, emitter, and base regions. The exposed portions of the substrate 201 are then etched to a desired depth (which is less than the thickness of the semiconductor layer 208), and a dielectric material, such as an oxide material, may be deposited to fill the trenches and then planarized to align with the surface of the substrate 201, resulting in shallow isolation regions 211-214. In accordance with selected embodiments, the depth of the shallow isolation regions 211-214 is in the range of about 0.05 microns to about 1 micron, and more preferably, within the range of about 0.5 microns to about 0.6 microns.

Figure 7:
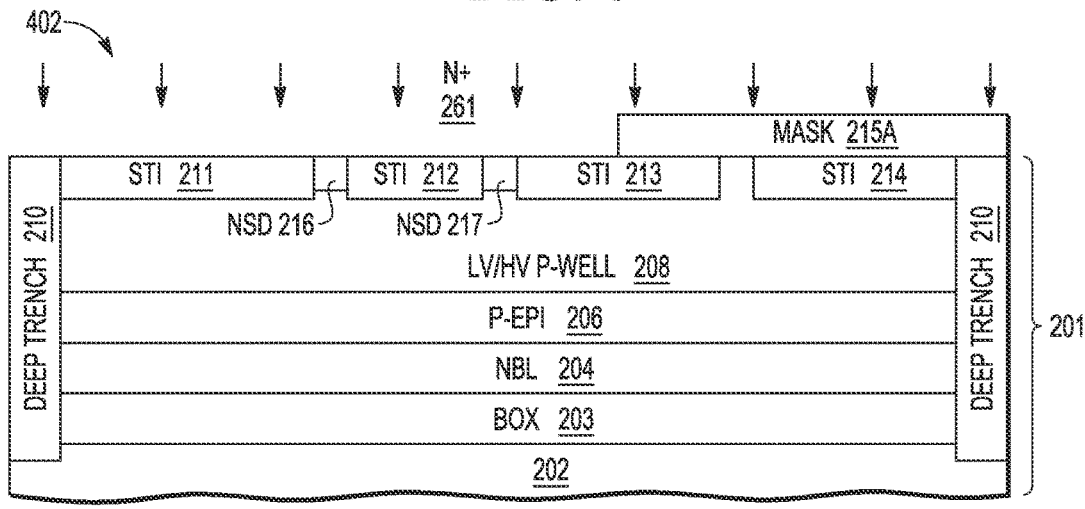

Referring next to FIG. 7, there is shown a partial cutaway side view 402 of the semiconductor substrate 201 subsequent to FIG. 6 after selectively implanting N+ source/drain regions through openings in the STI regions 211-213 to form the NSD collector and emitter contact regions 216, 217. While any desired N+ source/drain implantation process may be used, in selected embodiments, shallow N-type contact regions 216, 217 are formed by masking the protection device structure 402 with an implant masking 215A that is patterned to expose the portions of the heavily doped p-type semiconductor region or well 208 between isolation regions 211-213. With the implant mask 215A in place, an N+ implant step 261 is performed to implant shallow N-type regions 216, 217, such as by implanting n-type ions, such as phosphorous ions or arsenic ions, with a dopant concentration in the range of about 1E19 to 1E21 cm$^{-3}$ and at an energy level in the range of about 20 keV to about 100 keV to provide the N-type regions 216, 217 with a depth (after diffusion) that is less than a depth of the shallow isolation regions 211-213. For example, the depth of the shallow N-type regions 216, 217 may be in the range of about 0.05 microns to about 0.6 microns.

Figure 8:
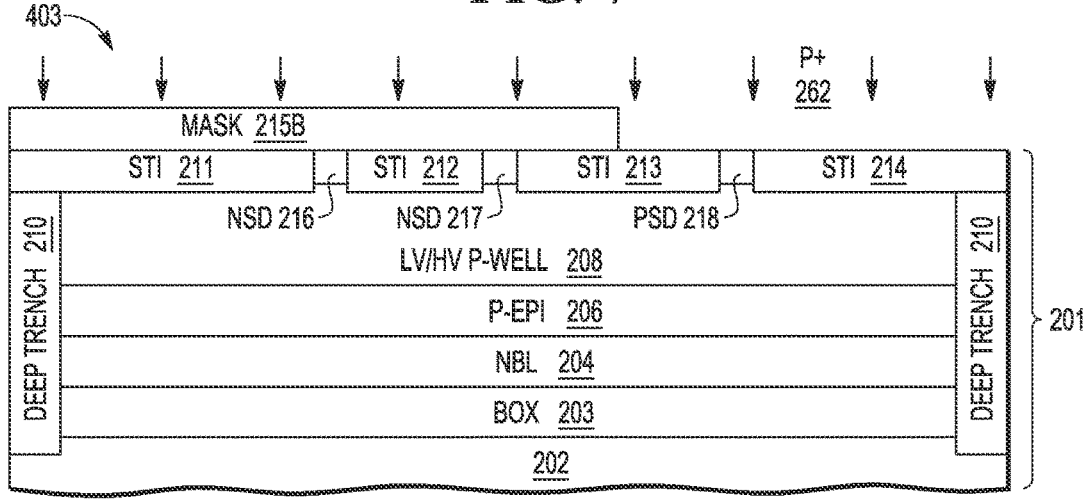

Referring next to FIG. 8, there is shown a partial cutaway side view 403 of the semiconductor substrate 201 subsequent to FIG. 7 after selectively implanting P+ source/drain regions through openings in the STI regions 213-214 to form the PSD base contact region 218. While any desired P+ source/drain implantation process may be used, in selected embodiments, shallow p-type contact region 218 is formed by stripping the implant masking 215A from the substrate 201, and then masking the protection device structure 403 with an implant masking 215B that is patterned to expose the portions of the heavily doped p-type semiconductor region or well 208 between isolation regions 213-214. With the implant mask 215B in place, a P+ implant step 262 is performed to implant shallow P-type region 218, such as by implanting p-type ions, such as boron ions, with a dopant concentration in the range of about 1E19 to 1E21 cm$^{-3}$ and at an energy level in the range of about 2 keV to about 50 keV to provide the P-type region 218 with a depth (after diffusion) that is less than a depth of the shallow isolation regions 213-214 (e.g., in the range of about 0.05 microns to about 0.6 microns).

Figure 9:
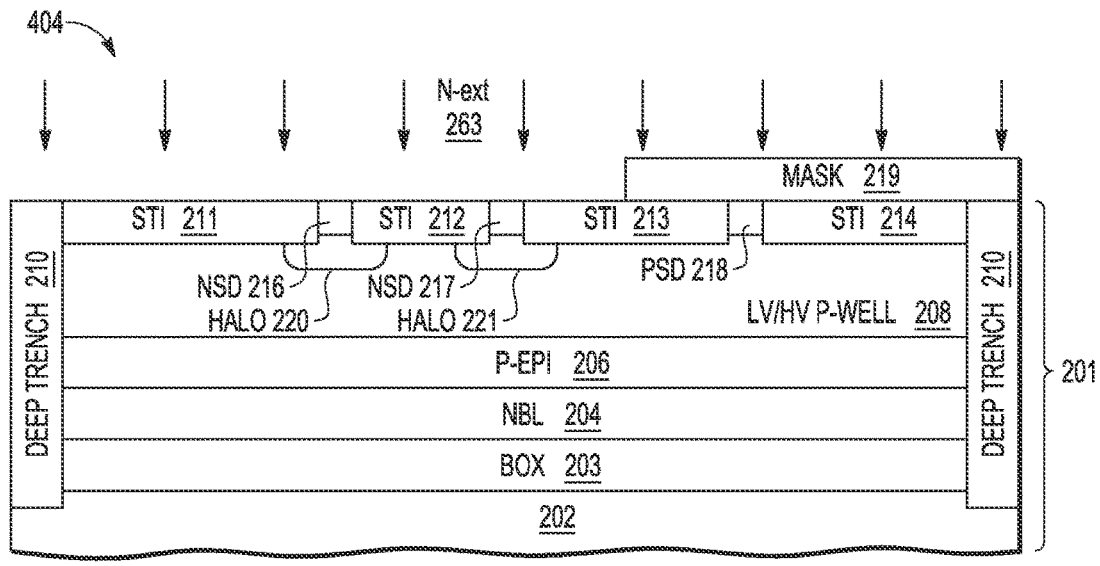

Referring next to FIG. 9, there is shown a partial cutaway side view 404 of the semiconductor substrate 201 subsequent to FIG. 8 after selectively implanting halo extension regions 220, 221 through openings in the STI regions 211-213 around only the collector and emitter contact regions 216, 217. While any desired implantation process may be used to form the halo extension regions 220, 221, in selected embodiments, the halo extension regions 220, 221 may be selectively implanted by masking the protection device structure 404 with an implant masking 219 that is patterned to expose the collector and emitter contact regions 216, 217. With the implant mask 219 in place, the halo extension regions 220, 221 may be formed with a first heavy and shallow n-type extension (N-ext) implant 263, such as by implanting n-type ions, such as arsenic ions, with a dopant concentration in the range of about 1E19 to 1E21 cm$^{-3}$ (e.g., 2E20 atoms/cm$^{-3}$) and at an energy level in the range of about 5 keV to about 10 keV. Before or after the first heavy and shallow n-type implant, the halo extension regions 220, 221 may be implanted with a second heavy and deeper p-type extension (P-ext) implant 264, such as by implanting p-type ions, such as boron ions, with a dopant concentration in the range of about 1E18 to 1E20 cm$^{-3}$ (e.g., 1E19 atoms/cm$^{-3}$) and at an energy level in the range of about 5 keV to about 15 keV. As formed, the halo extension regions 220, 221 surround and enclose the collector and emitter regions 216, 217, extending laterally under the STI regions 211-213. For example, in selected embodiments, the depth of the halo extension regions 220, 221 is about 0.7 microns to about 0.8 microns when the depth of the shallow isolation regions 213-214 is in the range of about 0.05 microns to about 0.6 microns.

Figure 10:
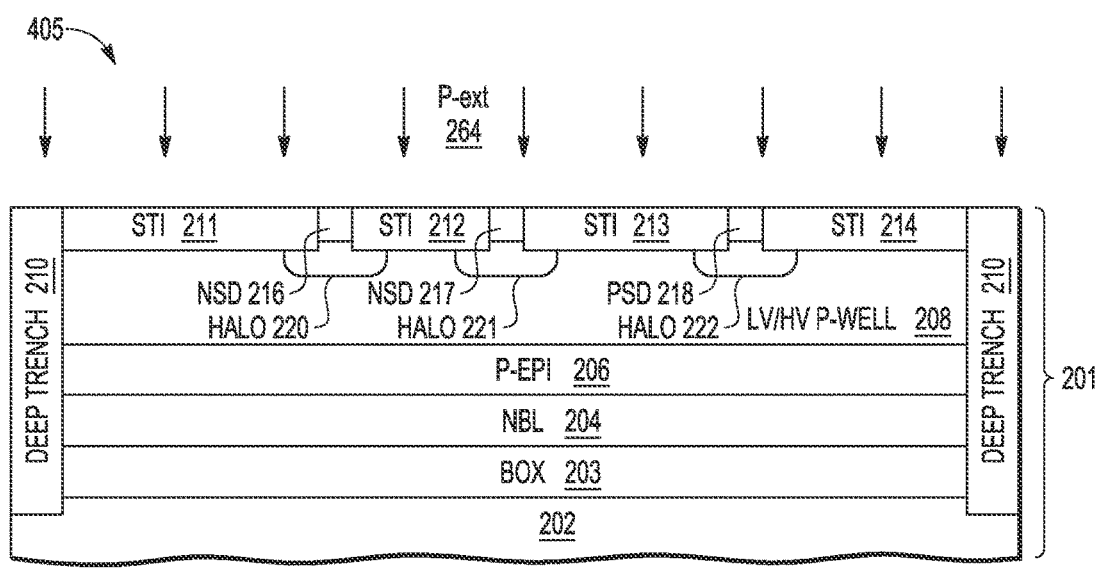

Referring next to FIG. 10, there is shown a partial cutaway side view 405 of the semiconductor substrate 201 subsequent to FIG. 8 after selectively implanting halo extension regions 220-222 through openings in the STI regions 211-214 around the collector, emitter, and base contact regions 216-218. Again, any desired implantation process may be used to form the halo extension regions 220-222, such as by implanting the halo extension regions 220, 221 without any implant masking 219 in place, instead using the STI regions 211-214 to protect the substrate 201 except where there are openings between the STI regions 211-214 that expose the collector, emitter, and base contact regions 216-218. For example, the halo extension regions 220-222 may be formed with a first heavy and shallow n-type implant, followed or preceded by a heavy and deeper p-type implant. As formed, the halo extension regions 220-222 are separately formed to surround and enclose the collector, emitter, and base contact regions 216-218, extending laterally under the STI regions 211-214.

As indicated above, the low voltage NPN electrostatic discharge (ESD) protection device has one or more halo structures formed around shallow collector and emitter regions along with a shallow base region which may or may not have a halo structure, depending on the embodiment. In each embodiment, the NPN ESD protection device provides improved failure current (It2) performance with a smaller footprint than conventional gate coupled (RC) NMOS-based clamps with less susceptibility to rectification to meet Direct Power Injection (DPI) electromagnetic compatibility (EMC) test specifications. To this end, the disclosed LVNPN BJT protection device may be implemented with a multi-finger configuration with the collector, emitter, and base regions being enhanced with halo extension structures formed with a p-type halo implant and n-type LDD implant. In other multi-finger embodiments, only the collector and emitter are enhanced with halo extension structures. In the latter case, the LVNPN BJT protection device with a halo-enhanced collector and emitter can provide higher holding voltage Vsb due to lower transistor gain (beta) of the NPN structure.

In either embodiment, the halo extension structures may be formed with a contact region extension implant that includes a heavy and shallow arsenic implant having a dopant concentration of approximately 2E20 atoms/cm3 and a heavy and deeper boron implant having a dopant concentration of approximately 1E19 atoms/cm3. With the halo extension structures, the emitter and collector junctions are effectively graded to allow the NPN device to support higher junction temperature, thus providing larger transient current conduction. In addition, the halo extension structures enable the lateral emitter-collector spacing dimension $W_B$ for the NPN device to be reduced to build compact ESD devices with the desired Vt1 value to meet the protection needs of different circuits. For example, since the initial triggering threshold voltage Vt1 is defined by the junction between the N+ collector and the underlying LVPW+PHV region, the Vt1 values of approximately 8.5V may be achieved with the $W_B$ spacing between the collector and emitter being drawn at 0.5 um. In addition, by including substrate isolation around each NPN device (e.g., with the buried oxide, NBL, and deep n-well trench regions), multiple NPN devices can be stacked together to provide ESD protection for higher voltage pins. For example, a first NPN device may provide ESD protection with Vt1=8.3V and Vsb=6V, while a two NPN devices stacked together may provide ESD protection with Vt1=17V and Vsb=12V.

Figure 11:
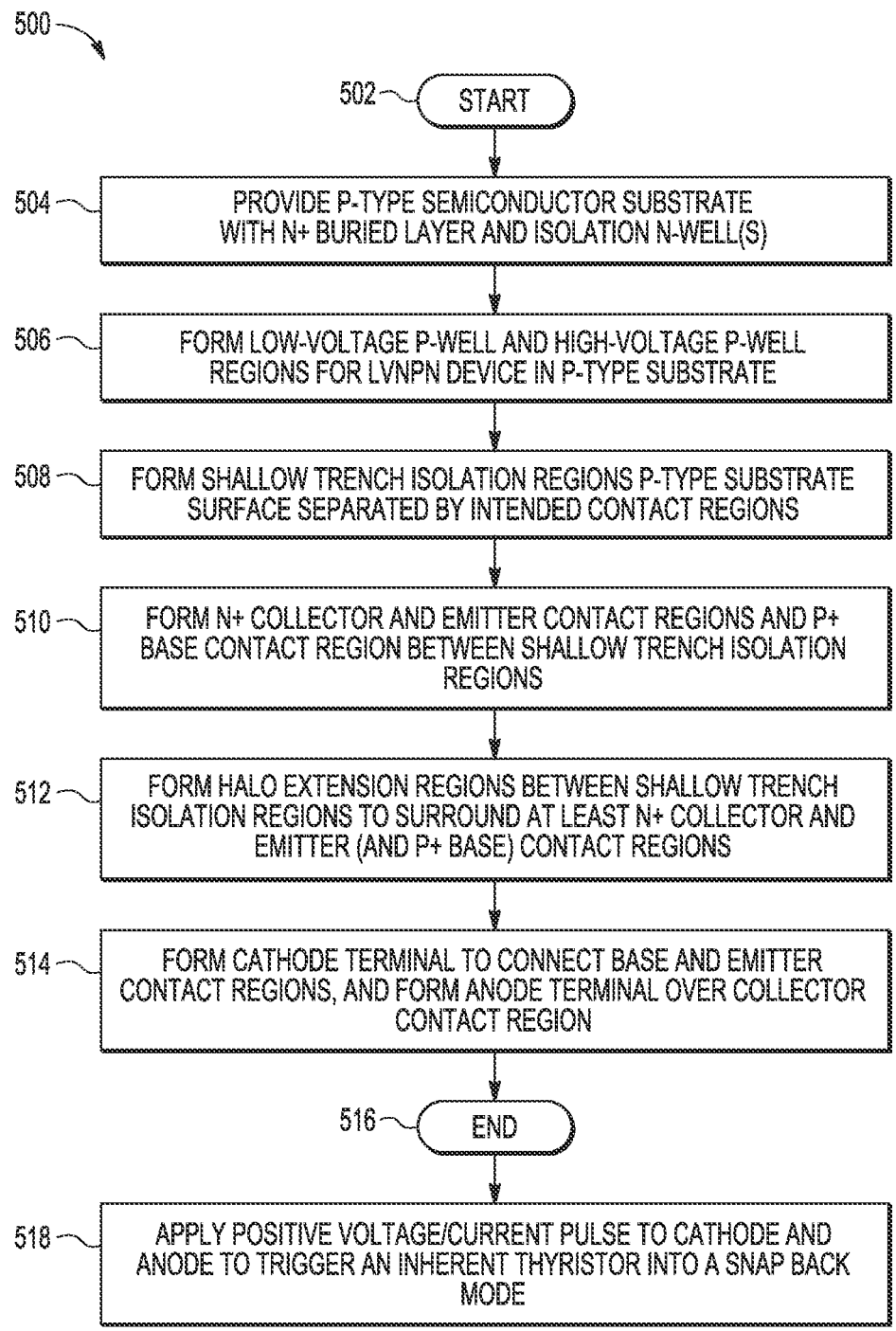
FIG. 11 is a simplified process flow chart illustrating various methods for fabricating and/or operating ESD protection devices in accordance with selected embodiments of the present disclosure.

To further illustrate selected embodiments of the present disclosure, reference is now made to FIG. 11 which shows a simplified process flow chart illustrating various methods 500 for fabricating and/or operating ESD protection devices in accordance with selected embodiments of the present disclosure. In describing the fabrication methodology 500, various reference numbers, doping types and concentrations are provided by way of examples of different regions that can be formed, but this is intended merely to facilitate understanding of various exemplary embodiments and not by way of limitation. Once the fabrication methodology starts (step 502), a semiconductor substrate is provided at step 504 which has a first conductivity type (e.g., p-type) and doping concentration (e.g., approximately $1E15$ cm$^{-3}$). Unless otherwise indicated, subsequent steps may be provided in any desired order. At this time, an N+ buried layer and one or more N-wells may be formed by selectively implanting and diffusing dopants having a second conductivity type (e.g., n-type) to define and isolate a subsequently-formed NPN device in the substrate. For example, the N+ buried layer may be formed by implanting and diffusing n-type dopants into the substrate to a predetermined implant energy and dopant concentration (e.g., 1E18 to 1E20 cm$^{-3}$). In addition, the isolation N-wells may be formed by using a mask to selectively diffuse or implant n-type impurities into the substrate to a predetermined implant energy and dopant concentration (e.g., 1E16 to 1E19 cm$^{-3}$) so as extend from the surface of the substrate and down to intersect with the N+ buried layer.

In the semiconductor substrate layer, a low voltage p-well (LVPW) region and p-type high voltage (PHV) region are formed in the substrate at step 506 to define the p-type base region of the NPN ESD protection device. For example, the low voltage p-well region may be formed by selectively diffusing or implanting p-type impurities using a predetermined implant energy and dopant concentration (e.g., 1E16 to 1E19 cm$^{-3}$, and more preferably 5E16 to 5E18 cm$^{-3}$, and more preferably 1E17 cm$^{-3}$) to a predetermined depth (e.g., 1-1.5 um), though other dopant types, depths, and/or concentrations may be used. In addition, the p-type high voltage region may be formed by selectively diffusing or implanting p-type impurities using a predetermined implant energy and dopant concentration (e.g., 1E15 to 1E18 cm$^{-3}$, and more preferably 5E15 to 5E17 cm$^{-3}$, and more preferably 1E16 cm$^{-3}$) to a predetermined depth (e.g., 1-1.5 um), though other dopant types, depths, and/or concentrations may be used.

At step 508, a plurality of shallow trench isolation (STI) regions are formed in the upper surface of the substrate with openings between the STI regions that define and delineate the emitter, collector, and base regions. As formed, the spacing of the substrate openings between the STI regions may be used to define the emitter-collector spacing dimension $W_B$ which controls the triggering voltage (Vt1) at the desired level. As will be appreciated, the STI regions may be formed by selectively etching trench openings in the substrate using an etch mask, filling the openings with appropriate isolation material(s), and then polishing or planarizing the isolation material(s) isolation down to the surface of the substrate.

At step 510, the N+ collector and emitter contact regions and the P+ base contact regions are formed in the substrate between the STI regions using a plurality of separate mask and implantation steps. For example, the P+ base contact regions may be formed by using a first implant mask to selectively diffuse or implant p-type impurities to form the base contact regions as shallow, highly doped p-type diffusions. The P+ contact regions are used to define in part the base regions in the NPN ESD protection devices. As will be appreciated, the P+ contact regions may be formed at the same time as the p-type source/drain regions are formed. Separately, the N+ collector and emitter contact regions may be formed by using a second implant mask to selectively diffuse or implant n-type impurities to form the emitter and collector contact regions as shallow, highly doped n-type diffusions. The first and second masks prevent the n-type and p-type impurities from implanting into the P+ and N+ contact regions respectively. However, it is the location and placement of the STI regions and the openings therebetween which control the location of the shallow N+ emitter contact region between the shallow N+ collector contact region and the shallow P+ base contact region.

At step 512, the halo extension regions are formed in the substrate between the STI regions using one or more implantation steps so that the halo extension regions surround and enclose at least the N+ collector and emitter contact regions, if not also the P+ base contact region. In selected embodiments, the halo extension regions may be formed by first implanting a heavy and shallow n-type impurity (e.g., arsenic) to form n-type lightly doped drain (LDD) regions. In addition or in the alternative, the halo extension regions may be formed by implanting a heavy and deeper p-type impurity (e.g., boron) to form p-type halo regions extend below the N+ collector and emitter contact regions (and P+ base contact region).

At step 514, one or more metallization or terminal electrode layers may be selectively formed over the N+ and P+ contact regions to connect the stacked ESD devices between a plurality of pins. As depicted, the fabrication methodology 500 ends at step 516, though it will be appreciated that additional front-end and back-end processing steps (not shown) may be performed.

After fabrication of the ESD protection device, the device is activated (step 518) to provide high voltage, bipolar-based ESD protection for low voltage pins against a single or dual polarity voltage or current pulse that is applied to any of the protected pins. When an ESD voltage is applied across a protected pin, the device goes into operation by triggering the bipolar junction transistor. Once triggered, the NPN ESD has a small snapback voltage of 2-3V which provides a low impedance path through the NPN ESD protection device for discharging the ESD current. Thus, the ESD protection device provides a compact solution with a low triggering voltage, Vt1, high snapback voltage Vsb, and high breakdown current ($I_{T2}$) for protecting low voltage pins against ESD events.

Figure 12:
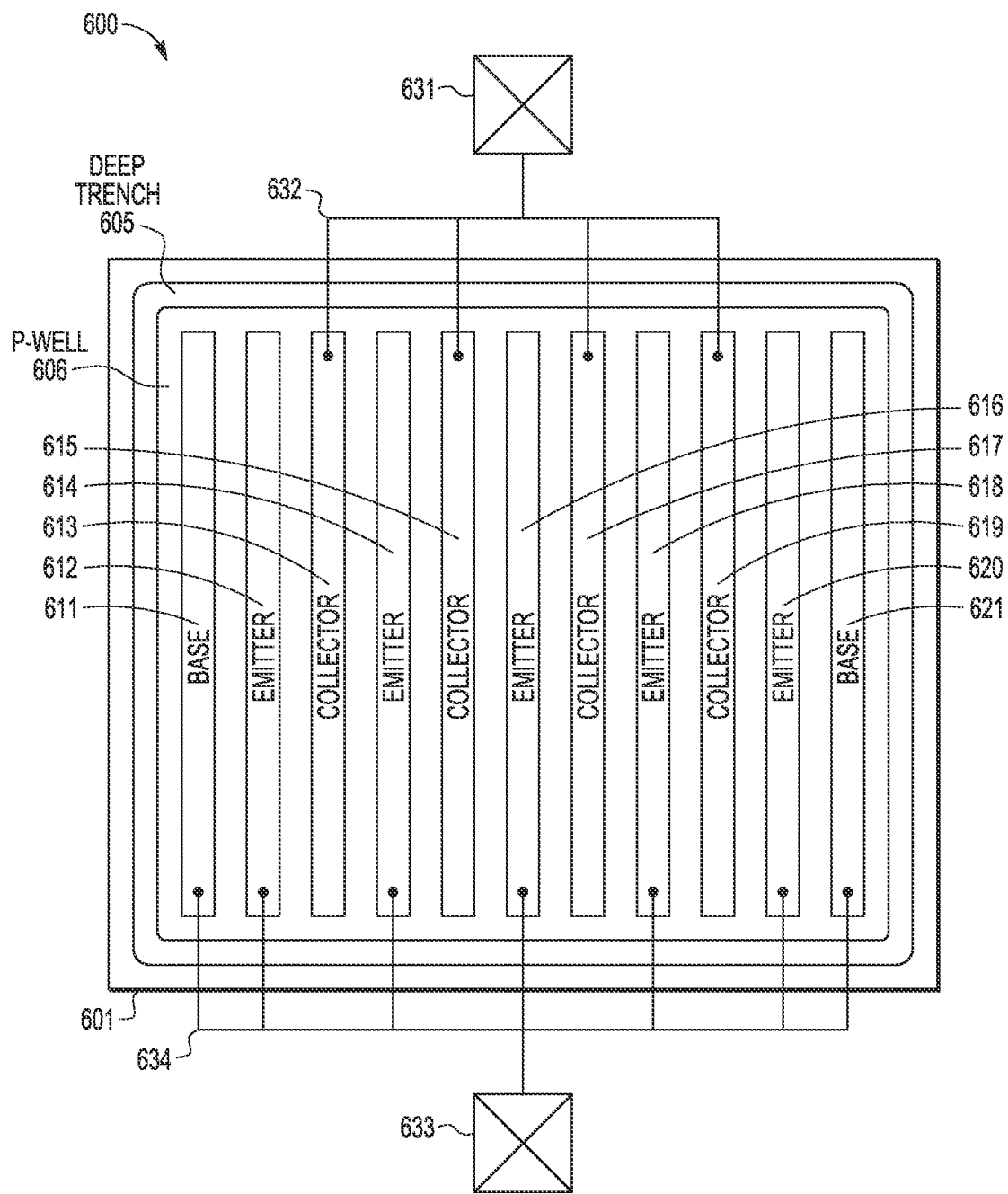
FIG. 12 is a plan view of an ESD protection device in accordance with selected multi-finger embodiments of the present disclosure.

As disclosed herein, selected embodiments of the NPN-based ESD protection circuit may be implemented with a multi-finger embodiment that is coupled between package interfaces of an electronic device package and in parallel to the functional circuitry of the device package being protected. In addition, multiple NPN-based ESD protection circuit elements may be configured electrically parallel to one another between package interfaces to improve the current handling capability of the protection circuitry (e.g., by increasing the damage onset threshold current). To illustrate an example embodiment, reference is now made to FIG. 12 which shows a plan view 600 of an ESD protection device 601 in accordance with selected multi-finger embodiments of the present disclosure. As illustrated, the substrate 601 includes a protective deep trench structure 605 surrounding a p-well region 606 in which a plurality of base, emitter, and collector electrode regions 611-621 are formed substantially in parallel with one another. Such a configuration may be referred to as a multi-finger configuration. Though the illustrated emitter electrode regions 612, 614, 616, 618, 620 and collector electrode regions 613, 615, 617, 619 are alternately arranged between a pair of outermost base electrode regions 611, 621, it will be appreciated that other electrode arrangements with additional or fewer electrode regions may be used. And though not shown in the plan view 600, it will also be appreciated that halo extension structures may be formed under at least the emitter electrode regions 612, 614, 616, 618, 620 and collector electrode regions 613, 615, 617, 619, if not also the base electrode regions 611, 621. To connect the multi-finger base, emitter, and collector electrode regions 611-621 into the ESD protection device 601, conductive material (not shown) is patterned, routed, or otherwise formed to short-circuit or otherwise provide a direct electrical connection between base regions 611, 621 and emitter electrode regions 612, 614, 616, 618, 620 as illustrated schematically with the electrical connection 634 provided between the electrically connected base and emitter electrodes and the lower voltage terminal 633. In a similar fashion, electrical connection 632 is provided between the collector electrode regions 613, 615, 617, 619 and the higher voltage terminal 631. Although not illustrated, it should be noted that instances of the multi-finger protection circuitry 601 may be stacked or otherwise configured electrically in series with one another between package interfaces 631, 633 to achieve increased voltage handling capability.

By now it should be appreciated that there is provided herein an electrostatic discharge (ESD) protection device for protecting a low voltage pin on an integrated circuit, along with associated methods of operation and fabrication. As disclosed, the EDS protection device includes a semiconductor substrate of a first conductivity type (e.g., n-type). In selected embodiments, the semiconductor substrate includes a first semiconductor layer of the first conductivity type and first doping level; a second epitaxial semiconductor layer of the first conductivity type and a second higher doping level overlying the first semiconductor layer, and a third semiconductor layer of the first conductivity type and a third higher doping level formed on the second epitaxial semiconductor layer, where the plurality of shallow trench isolation structures are formed at an upper surface of the third semiconductor layer. In addition, the semiconductor substrate may include a buried layer of the second conductivity type (e.g., n-type) located below and spaced apart from the shallow collector, emitter, and base regions (e.g., between the second epitaxial semiconductor layer and the third semiconductor layer). In the semiconductor substrate, a plurality of shallow trench isolation structures are formed to extend a first depth from an upper surface of the semiconductor substrate, thereby defining first, second and third substrate openings at the upper surface of the semiconductor substrate. A shallow collector region of a second conductivity type is formed in the first substrate opening adjacent to a first shallow trench isolation structure. In addition, a shallow emitter region of the second conductivity type is formed in the second substrate opening and laterally spaced apart from the shallow collector region by a second shallow trench isolation structure. In addition, a shallow base region of the first conductivity type is formed in the third substrate opening and laterally spaced apart from the shallow emitter region by a third shallow trench isolation structure. In selected embodiments, the shallow emitter region is laterally spaced apart from the shallow collector region by a spacing dimension (WB) having a controlled to set a triggering voltage (Vt1) for the ESD protection device at a desired level. In selected embodiments, first and second extension regions are formed to surround and enclose the shallow collector region and shallow emitter region, respectively. In other embodiments, comprising a third halo extension region is formed to surround and enclose the shallow base region. As formed, the halo extension regions may each include a first implant of the first conductivity type having a doping level that is greater than a doping level of the semiconductor substrate with which the halo extension regions make ohmic contact so that the halo extension regions extend below the shallow collector and emitter (and base) regions. In addition, the halo extension regions may each include a second implant of the second conductivity type having a shallow implant depth that is less than the implant depth of the first implant.

In another form, there is provided a method of fabricating a semiconductor device. In the disclosed methodology, a first region of semiconductor material having a first conductivity type (e.g., p-type) is formed in a semiconductor substrate. In selected embodiments, the first region of semiconductor material is formed by providing the semiconductor substrate of the first conductivity type having first doping level; forming an epitaxial semiconductor layer of the first conductivity type and a second higher doping level overlying the semiconductor substrate; and forming an upper semiconductor layer of the first conductivity type and a third higher doping level formed on the epitaxial semiconductor layer. On an upper surface of the semiconductor substrate, a plurality of shallow trench isolation structures is formed to define first and third substrate regions spaced apart on each side from a second substrate region in the semiconductor substrate. Collector and emitter contact regions of a second conductivity type (e.g., n-type) are formed in each of the first and second substrate regions, respectively, such as by selectively implanting dopants of the second conductivity type in each of the first and second substrate regions to an implant depth that is not as deep as the plurality of shallow trench isolation structures. In addition, a base contact region of the first conductivity type is formed in the third substrate region, such as by selectively implanting dopants of the first conductivity type in each of the third substrate region to an implant depth that is not as deep as the plurality of shallow trench isolation structures. In addition, separate halo extension regions are formed to surround and enclose at least the collector and emitter contact regions, if not also the base contact region. To form the separate halo extension regions, dopants of the first conductivity type may be implanted in the first and second (and third) substrate regions using the plurality of shallow trench isolation structures as an implant mask to form first implant regions that extend below the collector and emitter contact regions. In addition, dopants of the second conductivity type may be implanted in the first and second (and third) substrate regions using the plurality of shallow trench isolation structures as an implant mask to form second implant regions having an implant depth that is shallower than the first implant regions. Subsequently, first and second terminals are formed such that the first terminal is in electrical contact with the emitter and base contact regions and the second terminal is in electrical contact with the collector contact region, thereby forming a single polarity electrostatic discharge (ESD) clamp coupled between the first and second terminals.

In yet other embodiments, there is disclosed a method and system for providing ESD protection. As disclosed, an electrostatic discharge (ESD) protection structure is provided in an integrated circuit. As formed, the provided ESD protection structure includes a first semiconductor region of a first conductivity type in which is formed a shallow collector contact region of a first conductivity type. The ESD protection structure also includes a shallow emitter contact region of the first conductivity type located next to and spaced apart from the shallow collector contact region and a shallow base contact region of a second, opposite conductivity type located next to and spaced apart from the shallow emitter contact region. The ESD protection structure also includes halo extension regions extending below at least the shallow collector and emitter contact regions, respectively. In selected embodiments, the ESD protection structure also includes a halo extension region extending below the shallow base contact region. To provide ESD protection, the shallow emitter and base contact regions are connected to a first grounded terminal and the shallow collector contact region is connected to a second terminal. In this configuration, when a positive voltage is applied between the second terminal and the first grounded terminal of the integrated circuit that has a magnitude greater than a trigger value, the ESD protection structure enters a snap-back condition.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of fabricating a semiconductor device comprising:
    forming a first region of semiconductor material having a first conductivity type over a semiconductor substrate layer;
        forming an epitaxial semiconductor layer of a second conductivity type having a first doping level and overlying the semiconductor substrate layer;
        forming an upper semiconductor layer of the second conductivity type having a second doping level higher than the first doping level over the epitaxial semiconductor layer;
    forming a plurality of shallow trench isolation structures on an upper surface of the semiconductor device to define first and third substrate regions spaced apart on each side from a second substrate region over the semiconductor layer;
    forming collector and emitter contact regions of the second conductivity type in each of the first and second substrate regions, respectively;
    forming a base contact region of the first conductivity type in the third substrate region;
    forming separate halo extension regions to surround and enclose at least the collector and emitter contact regions; and
    forming first and second terminals such that the first terminal comprises emitter and base contact terminals in direct contact with the emitter and base contact regions and such that the second terminal comprises a collector contact terminal in electrical contact with the collector contact region, thereby forming a single polarity electrostatic discharge (ESD) clamp coupled between the first and second terminals.

2. The method of claim 1, where the first conductivity type is n-type, and the second conductivity type is p-type.

3. The method of claim 1, where forming the collector and emitter contact regions comprises selectively implanting dopants of the second conductivity type in each of the first and second substrate regions to an implant depth that is not as deep as the plurality of shallow trench isolation structures.

4. The method of claim 1, where forming the base contact region comprises selectively implanting dopants of the first conductivity type in the third substrate region to an implant depth that is not as deep as the plurality of shallow trench isolation structures.

5. The method of claim 1, where forming separate halo extension regions comprises forming a separate halo extension region to surround and enclose the base contact region.

6. The method of claim 1, where forming separate halo extension regions comprises implanting dopants of the first conductivity type in at least the first and second substrate regions using the plurality of shallow trench isolation structures as an implant mask to form first implant regions that extend below the collector and emitter contact regions.

7. The method of claim 6, where forming separate halo extension regions comprises implanting dopants of the second conductivity type in at least the first and second substrate regions using the plurality of shallow trench isolation structures as an implant mask to form second implant regions having an implant depth that is shallower than the first implant regions.

8. A method comprising:
providing an electrostatic discharge (ESD) protection structure in an integrated circuit, wherein the ESD protection structure comprises:
a first semiconductor region of a first conductivity type in which is formed a shallow collector contact region of a second conductivity type that is opposite the first conductivity type, where the first semiconductor region of the first conductivity type is formed with a first doping level to overlay an epitaxial semiconductor layer of the first conductivity type and a second lower doping level, where the epitaxial semiconductor layer is formed over a semiconductor substrate of the first conductivity type having third doping level which is lower than the first and second doping levels;
a shallow emitter contact region of the second conductivity type located next to and spaced apart from the shallow collector contact region;
a shallow base contact region of first conductivity type located next to and spaced apart from the shallow emitter contact region; and
a collector halo extension region and emitter halo extension region extending below at least the shallow collector and emitter contact regions, respectively, where the shallow emitter and base contact regions are directly connected to emitter and base contact terminals of a first grounded terminal and where the shallow collector contact region is connected to a collector contact terminal of a second terminal; and
applying a positive voltage between the second terminal and the first grounded terminal of the integrated circuit.

9. The method of claim 8, where the ESD protection structure comprises a halo extension region extending below at least the shallow base contact region.

10. A method of fabricating a semiconductor device comprising:
forming, in a semiconductor substrate of a first conductivity type and having a first doping level, an uppermost first region of semiconductor material having the first conductivity type over a buried well region of a second, opposite conductivity type by:
forming an epitaxial semiconductor layer of the first conductivity type and a second higher doping level than the first doping level overlying the buried well region; and
forming the uppermost first region of semiconductor material of the first conductivity type and a third higher doping level than the second doping level over the epitaxial semiconductor layer;
forming one or more shallow trench isolation structures on an upper surface of the uppermost first region of semiconductor material to define an outer base contact location and a plurality of alternating collector and emitter contact locations in a multi-finger arrangement in the semiconductor substrate;
forming collector and emitter contact regions of a second conductivity type in the plurality of alternating collector and emitter contact locations;
forming a base contact region of the first conductivity type in the outer base contact location; and
forming separate collector halo extension regions and emitter halo extension regions to surround and enclose at least the collector and emitter contact regions; and
forming first and second terminals such that the first terminal comprises emitter and base contact terminals in electrical contact with the emitter and base contact region regions and the second terminal comprises a collector contact terminal in electrical contact with the collector contact region, thereby forming a single polarity electrostatic discharge (ESD) clamp coupled between the first and second terminals.

11. The method of claim 10, further comprising forming separate base halo extension regions to surround and enclose at least the base contact region.

* * * * *